United States Patent
Snider et al.

(10) Patent No.: US 9,731,580 B2
(45) Date of Patent: Aug. 15, 2017

(54) SLIDER WINDOW ASSEMBLY WITH SENSOR

(71) Applicant: MAGNA MIRRORS OF AMERICA, INC., Holland, MI (US)

(72) Inventors: Darin J. Snider, Holland, MI (US); Qi Xiao Young, Holland, MI (US)

(73) Assignee: MAGNA MIRRORS OF AMERICA, INC., Holland, MI (US)

( * ) Notice: Subject to any disclaimer, the term of this patent is extended or adjusted under 35 U.S.C. 154(b) by 0 days.

(21) Appl. No.: 14/920,172

(22) Filed: Oct. 22, 2015

(65) Prior Publication Data

US 2016/0121699 A1    May 5, 2016

Related U.S. Application Data

(60) Provisional application No. 62/072,049, filed on Oct. 29, 2014.

(51) Int. Cl.
*B60J 1/18* (2006.01)
*E05F 15/60* (2015.01)
*G01V 3/08* (2006.01)
*G01R 33/07* (2006.01)
*E05F 15/643* (2015.01)
*E05F 11/53* (2006.01)

(52) U.S. Cl.
CPC ............ *B60J 1/1853* (2013.01); *E05F 15/60* (2015.01); *E05F 15/643* (2015.01); *G01R 33/07* (2013.01); *G01V 3/08* (2013.01); *E05F 11/535* (2013.01); *E05Y 2900/55* (2013.01)

(58) Field of Classification Search
None
See application file for complete search history.

(56) References Cited

U.S. PATENT DOCUMENTS

| | | | |
|---|---|---|---|
| 957,728 | A | 5/1910 | Bliss |
| 1,204,702 | A | 11/1916 | Schupp |
| 2,762,675 | A | 9/1956 | Janows |
| 2,858,408 | A | 10/1958 | Barroero |
| 2,912,714 | A | 11/1959 | Rich |
| 2,962,773 | A | 12/1960 | Heller |
| 3,177,989 | A | 4/1965 | Di Chiaro |
| 3,237,250 | A | 3/1966 | Scoville |

(Continued)

*Primary Examiner* — Gregory Strimbu
(74) *Attorney, Agent, or Firm* — Gardner, Linn, Burkhart & Flory, LLP

(57) ABSTRACT

A slider window assembly for a vehicle includes (i) a frame portion having upper and lower rails, (ii) at least one fixed window panel at least partially defining an opening, and (iii) a movable window panel that is movable along the upper and lower rails between a closed position and an opened position. A sensing system is operable to determine when the movable window panel is in the closed position and when the movable window panel is not in the closed position. The sensing system includes a magneto-responsive sensor connected to the frame portion and a magnetic element connected to the movable window panel. When the movable window panel is in the closed position, the sensor detects the the magnetic element. When the sensing system determines that the movable window panel is not in the closed position, an indicator is activated to alert the vehicle driver that the movable window panel is not closed.

20 Claims, 13 Drawing Sheets

(56) References Cited

U.S. PATENT DOCUMENTS

| | | |
|---|---|---|
| 3,379,859 A | 4/1968 | Marriott |
| 3,508,361 A | 4/1970 | Ryder |
| 3,715,707 A | 2/1973 | Anderson |
| 3,893,260 A | 7/1975 | Caiou |
| 3,898,427 A | 8/1975 | Levin et al. |
| 3,911,245 A | 10/1975 | O'Shaughnessy |
| 3,964,068 A | 6/1976 | Torii et al. |
| 3,995,142 A | 11/1976 | Ciardelli et al. |
| 4,023,008 A | 5/1977 | Durussel |
| 4,065,848 A | 1/1978 | Dery |
| 4,081,926 A | 4/1978 | Jardin |
| 4,124,054 A | 11/1978 | Spretnjak |
| 4,137,447 A | 1/1979 | Boaz |
| 4,158,270 A | 6/1979 | Cherbourg et al. |
| 4,171,594 A | 10/1979 | Colanzi |
| 4,244,774 A | 1/1981 | Dery |
| RE30,663 E | 6/1981 | Schnitzius |
| 4,388,522 A | 6/1983 | Boaz |
| 4,410,843 A | 10/1983 | Sauer et al. |
| 4,415,196 A | 11/1983 | Baum et al. |
| 4,450,346 A | 5/1984 | Boaz |
| 4,458,445 A | 7/1984 | Sauer et al. |
| 4,519,443 A | 5/1985 | Sutoh et al. |
| 4,552,611 A | 11/1985 | Dery et al. |
| 4,606,159 A | 8/1986 | Kunert |
| 4,611,849 A | 9/1986 | Trenkler |
| 4,635,398 A | 1/1987 | Nakamura |
| 4,674,231 A | 6/1987 | Radek et al. |
| 4,723,809 A | 2/1988 | Kida et al. |
| 4,738,052 A | 4/1988 | Yoshida |
| 4,785,583 A | 11/1988 | Kawagoe et al. |
| 4,883,940 A | 11/1989 | Tokarz |
| 4,920,698 A | 5/1990 | Friese et al. |
| 4,934,098 A | 6/1990 | Prouteau et al. |
| 4,970,911 A | 11/1990 | Ujihara et al. |
| 4,995,195 A | 2/1991 | Olberding et al. |
| 5,046,283 A | 9/1991 | Compeau et al. |
| 5,146,712 A | 9/1992 | Hlavaty |
| 5,228,740 A | 7/1993 | Saltzman |
| 5,245,788 A | 9/1993 | Riegelman |
| 5,294,168 A | 3/1994 | Kronbetter |
| 5,308,247 A | 5/1994 | Dyrdek |
| 5,333,411 A | 8/1994 | Tschirschwitz et al. |
| 5,345,717 A | 9/1994 | Mori et al. |
| 5,363,596 A | 11/1994 | Kronbetter |
| 5,367,827 A | 11/1994 | Tajima et al. |
| 5,442,880 A | 8/1995 | Gipson |
| 5,466,911 A | 11/1995 | Spagnoli et al. |
| 5,467,560 A | 11/1995 | Camp et al. |
| 5,473,840 A | 12/1995 | Gillen et al. |
| 5,505,023 A | 4/1996 | Gillen et al. |
| 5,522,191 A | 6/1996 | Wenner et al. |
| 5,525,401 A | 6/1996 | Hirmer |
| 5,531,046 A | 7/1996 | Kollar et al. |
| 5,542,214 A | 8/1996 | Buening |
| 5,572,376 A | 11/1996 | Pace |
| 5,613,323 A * | 3/1997 | Buening .................... B60J 1/16 49/130 |
| 5,617,675 A | 4/1997 | Kobrehel |
| 5,711,112 A | 1/1998 | Barten et al. |
| 5,716,536 A | 2/1998 | Yokoto et al. |
| 5,724,769 A | 3/1998 | Cripe et al. |
| 5,724,771 A | 3/1998 | Gipson |
| 5,784,833 A | 7/1998 | Sponable et al. |
| 5,799,444 A | 9/1998 | Freimark et al. |
| 5,799,449 A | 9/1998 | Lyons et al. |
| 5,822,922 A | 10/1998 | Grumm et al. |
| 5,836,110 A | 11/1998 | Buening |
| 5,853,895 A | 12/1998 | Lewno |
| 5,890,321 A | 4/1999 | Staser et al. |
| 5,953,887 A | 9/1999 | Lucas et al. |
| 5,996,284 A | 12/1999 | Freimark et al. |
| 6,014,840 A | 1/2000 | Ray et al. |
| 6,026,611 A | 2/2000 | Ralston et al. |
| 6,086,138 A | 7/2000 | Xu et al. |
| 6,112,462 A | 9/2000 | Kolar |
| 6,119,401 A | 9/2000 | Lin et al. |
| 6,119,402 A | 9/2000 | Wisner |
| 6,125,585 A | 10/2000 | Koneval et al. |
| 6,161,894 A | 12/2000 | Chapman |
| 6,223,470 B1 | 5/2001 | Millard et al. |
| 6,225,904 B1 | 5/2001 | Jaffe et al. |
| 6,293,609 B1 | 9/2001 | Xu et al. |
| 6,324,788 B1 | 12/2001 | Koneval et al. |
| 6,328,243 B1 | 12/2001 | Yamamoto |
| 6,490,832 B1 | 12/2002 | Fischbach et al. |
| 6,525,659 B2 | 2/2003 | Jaffe et al. |
| 6,591,552 B1 | 7/2003 | Rasmussen |
| 6,598,931 B2 | 7/2003 | Tamura |
| 6,665,983 B1 * | 12/2003 | Zimmerman ......... E05B 47/026 49/25 |
| 6,691,464 B2 | 2/2004 | Nestell et al. |
| 6,742,819 B2 | 6/2004 | So et al. |
| 6,766,617 B2 | 7/2004 | Purcell |
| 6,955,009 B2 | 10/2005 | Rasmussen |
| 7,003,916 B2 | 2/2006 | Nestell et al. |
| 7,010,883 B2 | 3/2006 | Jaerpsten et al. |
| 7,073,293 B2 | 7/2006 | Galer |
| 7,184,190 B2 | 2/2007 | McCabe et al. |
| 7,186,118 B2 | 3/2007 | Hansen et al. |
| 7,255,451 B2 | 8/2007 | McCabe et al. |
| 7,259,359 B2 | 8/2007 | Davey et al. |
| 7,400,435 B2 | 7/2008 | Byers et al. |
| 7,608,949 B2 | 10/2009 | Busch |
| 7,626,749 B2 | 12/2009 | Baur et al. |
| 7,871,272 B2 | 1/2011 | Firman et al. |
| 7,900,863 B1 | 3/2011 | Cheng |
| 8,042,664 B2 | 10/2011 | Rutkowski et al. |
| 8,151,519 B2 * | 4/2012 | Bello .................... E05F 15/643 49/116 |
| 8,402,695 B2 | 3/2013 | Smith et al. |
| 8,881,458 B2 | 11/2014 | Snider et al. |
| 8,915,018 B2 | 12/2014 | Snider |
| 8,938,914 B2 | 1/2015 | Hulst et al. |
| 2003/0074842 A1 | 4/2003 | Eckhardt et al. |
| 2003/0140562 A1 | 7/2003 | Staser et al. |
| 2003/0188490 A1 | 10/2003 | Kraus et al. |
| 2003/0213179 A1 | 11/2003 | Galer |
| 2004/0020131 A1 * | 2/2004 | Galer .................... B60J 1/1861 49/413 |
| 2004/0065017 A1 | 4/2004 | Priest et al. |
| 2004/0065018 A1 | 4/2004 | Ragnier et al. |
| 2006/0032140 A1 * | 2/2006 | Arimoto ............... E05F 15/646 49/209 |
| 2006/0061008 A1 | 3/2006 | Karner et al. |
| 2006/0107600 A1 | 5/2006 | Nestell et al. |
| 2006/0130405 A1 | 6/2006 | Hemond et al. |
| 2007/0075859 A1 * | 4/2007 | Garavuso ............... G08B 13/08 340/547 |
| 2007/0209283 A1 | 9/2007 | Ostrowski et al. |
| 2007/0277443 A1 | 12/2007 | Dery et al. |
| 2008/0122262 A1 | 5/2008 | Cicala |
| 2008/0127563 A1 | 6/2008 | Tooker |
| 2008/0202032 A1 | 8/2008 | Loidolt |
| 2009/0019778 A1 * | 1/2009 | Lahnala ................ B60J 1/1853 49/413 |
| 2009/0140858 A1 * | 6/2009 | Gore .................... G08B 13/04 340/547 |
| 2009/0322705 A1 | 12/2009 | Halsey, IV |
| 2010/0146859 A1 * | 6/2010 | Gipson ................. B60J 1/1853 49/348 |
| 2010/0154312 A1 | 6/2010 | Gipson et al. |
| 2010/0182143 A1 | 7/2010 | Lynam |
| 2010/0194550 A1 * | 8/2010 | Suzuki ...................... B60J 1/17 340/426.1 |
| 2010/0240229 A1 | 9/2010 | Firman et al. |
| 2011/0030276 A1 | 2/2011 | Smith et al. |
| 2012/0091113 A1 * | 4/2012 | Bennett ................. B60J 1/1853 219/203 |
| 2013/0283693 A1 * | 10/2013 | Huizen ................. B60J 1/1853 49/123 |
| 2014/0047772 A1 | 2/2014 | Hulst |

(56) References Cited

U.S. PATENT DOCUMENTS

| | | | |
|---|---|---|---|
| 2014/0062466 A1* | 3/2014 | Thibault | G01B 7/14 324/207.22 |
| 2015/0167372 A1* | 6/2015 | Hulst | B60J 1/1853 49/123 |
| 2015/0348385 A1* | 12/2015 | Lamb | G08B 29/20 340/547 |

* cited by examiner

SLIDER WINDOW ASSEMBLY WITH SENSOR

CROSS REFERENCE TO RELATED APPLICATION

The present application is related to U.S. provisional application Ser. No. 62/072,049, filed Oct. 29, 2014, which is hereby incorporated herein by reference in its entirety.

FIELD OF THE INVENTION

The present invention relates to a slider window assembly for a vehicle and, more particularly, a rear slider window assembly for a vehicle and, more particularly, a rear slider window assembly for a pickup truck or the like.

BACKGROUND OF THE INVENTION

It is known to provide a slider window assembly for an opening of a vehicle, such as a rear slider window assembly for a rear opening of a pickup truck. Conventional slider window assemblies for rear openings of trucks or the like typically include three or more panels, such as two fixed window panels and a slidable window panel. The slidable window panel is supported by rails and may be moved along the rails to open and close the window. The slidable window panel may be driven or moved by a cable drive system, such as described in U.S. Pat. No. 8,151,519, which is hereby incorporated herein by reference in its entirety.

SUMMARY OF THE INVENTION

The present invention provides a rear slider window assembly that has a lower channel that slidably receives the movable window panel (and carrier at the lower region of the movable window panel) therein, with a sensing device that senses when the movable window panel is in its fully closed position. The window assembly includes a carrier of a movable window panel that is received in and moved along the lower channel via operation of a powered window drive system, which imparts movement of the carrier and movable window along the lower channel between its opened and closed positions via moving or pulling at a drive cable attached at either end of the carrier, with a sheath of the cable engaged at the ends of the channel. The sensing device comprises a non-contact switch or sensor, such as a Hall Effect sensor or other magneto-responsive sensor or the like, disposed at an end region of the lower channel and a magnetic element disposed at an end of the carrier of the movable window panel, such that, when the window is closed, the magnetic element is in close proximity to with the sensing device, which detects the close proximity and determines that the window is fully closed. When the movable window panel is not in its closed position, the magneto-responsive sensor is spaced from or not in close proximity to the magnetic element and thus does not detect the proximity of the magnetic element.

Responsive to determination of the close proximity of the magnetic element to the sensor, the system may control an indicator to indicate to the driver of the vehicle that the window is opened or closed. For example, the system may activate an indicator (such as a light or LED in the cabin of the vehicle and viewable by the driver of the vehicle) when the window is at least partially opened (as determined by the sensor not detecting the close proximity of the magnetic element), and the system may deactivate the indicator when the sensor detects the close proximity of the magnetic element and thus determines that the window is fully closed.

Therefore, the sensing system and alert or indication system of the present invention provides for sensing when the rear slider window is not fully closed via a non-contacting and non-mechanical sensing means, and thus avoids use of mechanical movable switches and the like.

These and other objects, advantages, purposes and features of the present invention will become apparent upon review of the following specification in conjunction with the drawings.

DESCRIPTION OF THE PREFERRED EMBODIMENTS

Figure 1:
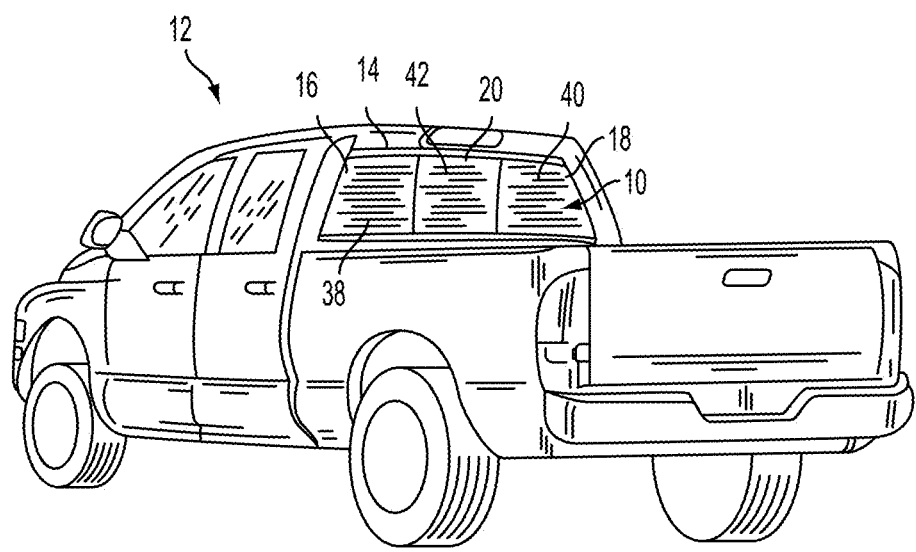
FIG. 1 is a rear perspective view of a pickup truck having a rear slider window assembly in accordance with the present invention.
Figure 2:
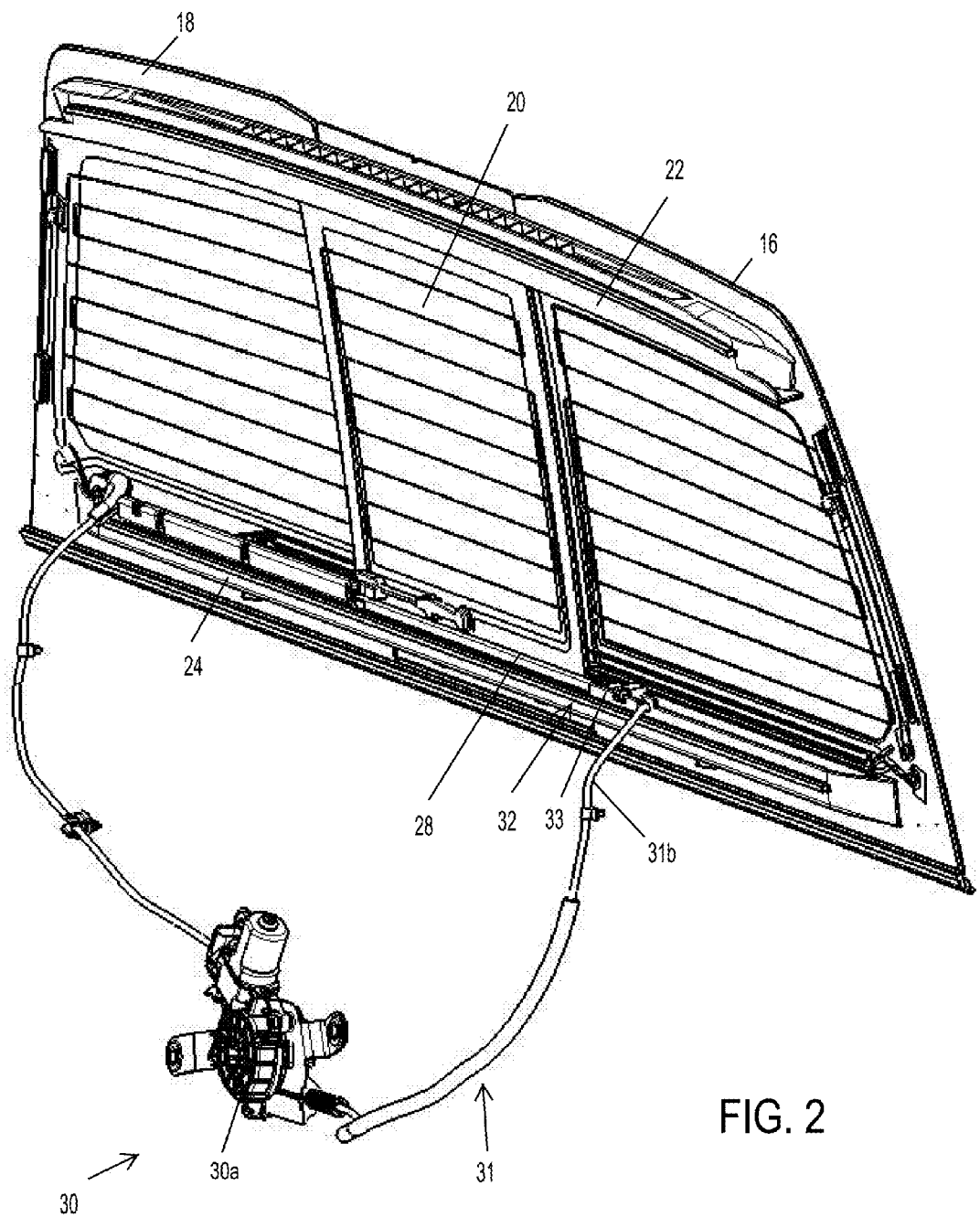
FIG. 2 is a perspective view of the rear slider window assembly of the present invention, as viewed from the forward or interior side of the window assembly when the window assembly is normally mounted to a vehicle.
Figure 3:
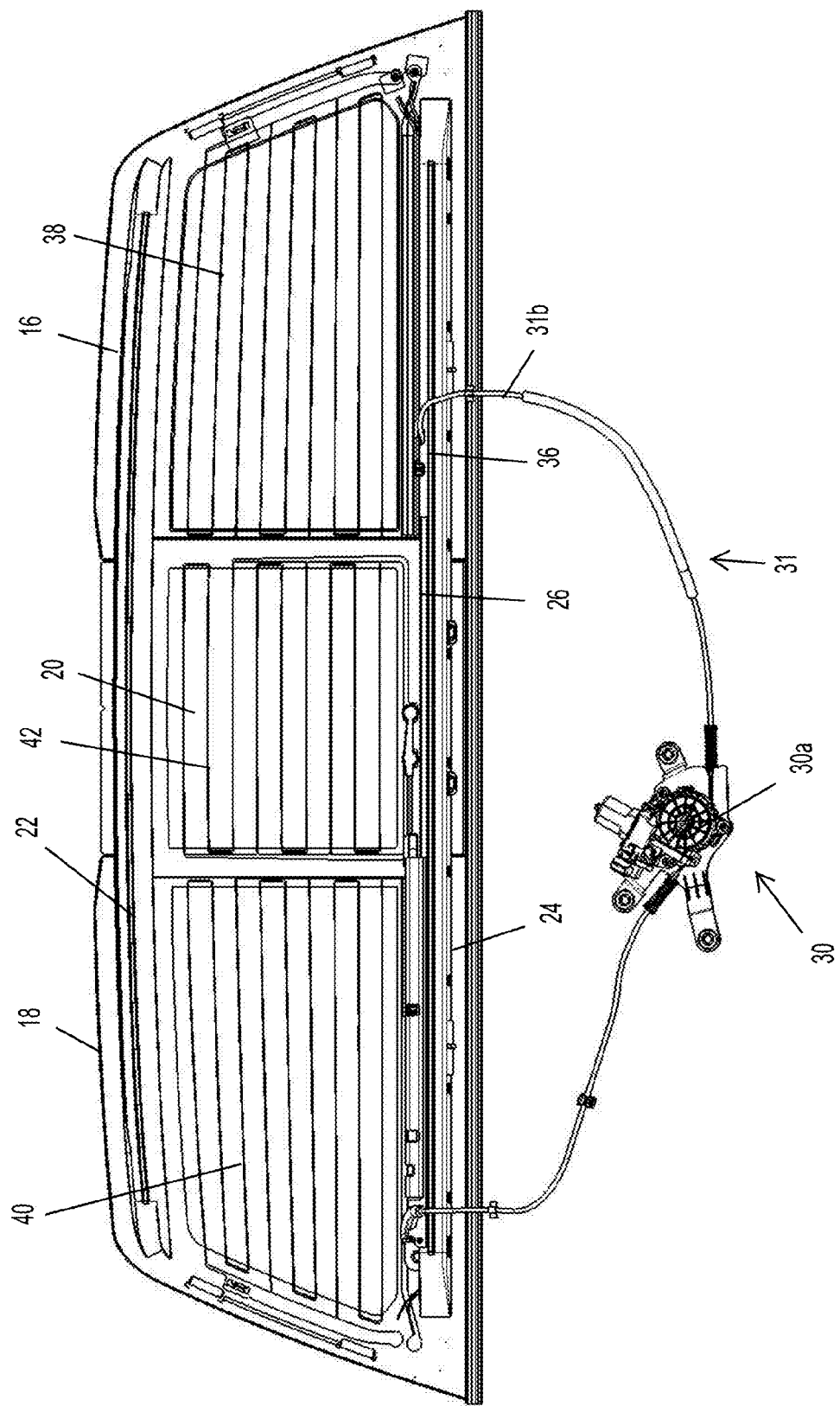
FIG. 3 is a plan view of the rear slider window assembly of FIG. 2.
Figure 4:
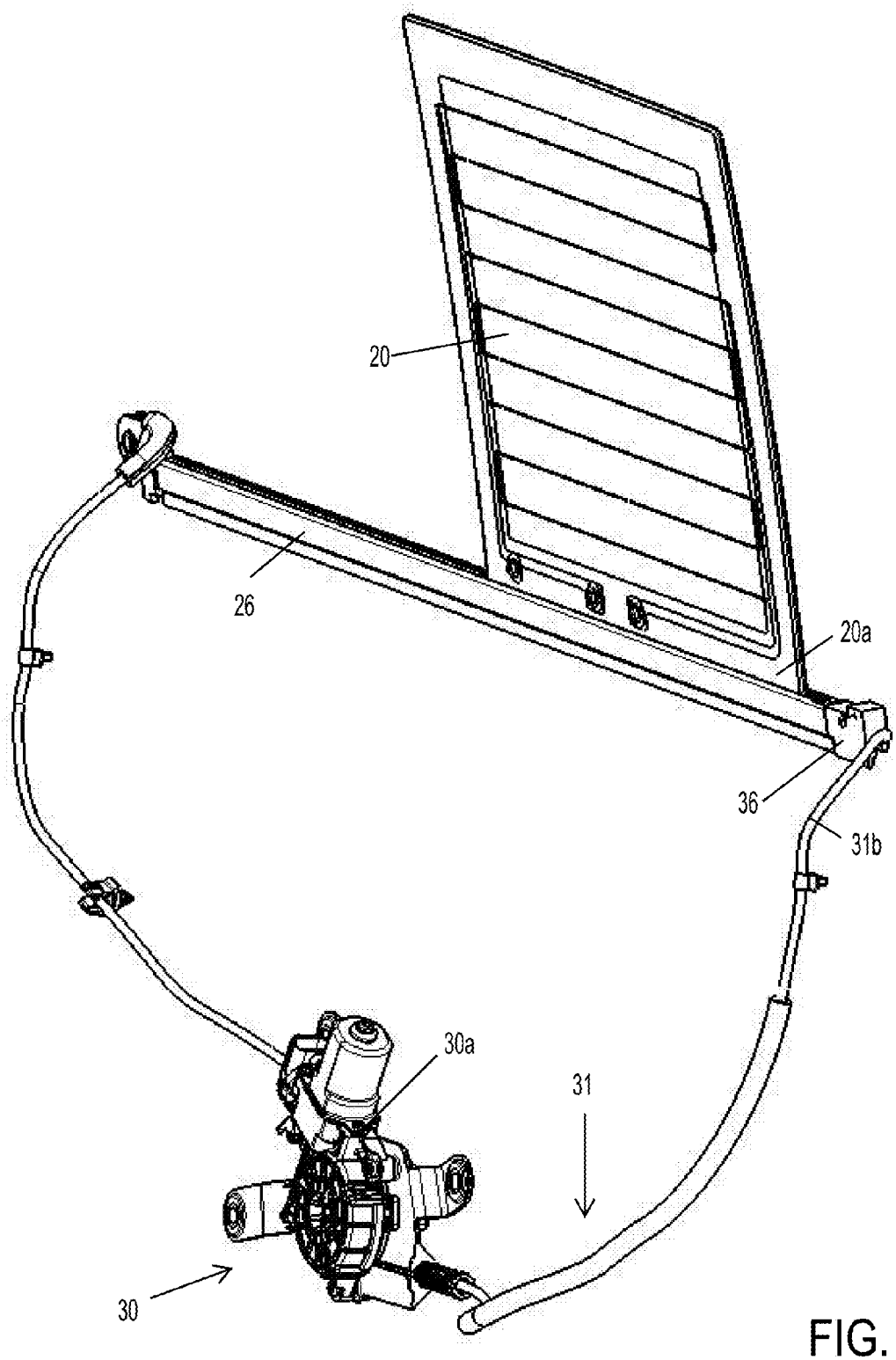
FIG. 4 is a perspective view of a movable window panel and lower rail or channel element and drive system of the rear slider window assembly of FIGS. 2 and 3.
Figure 5:
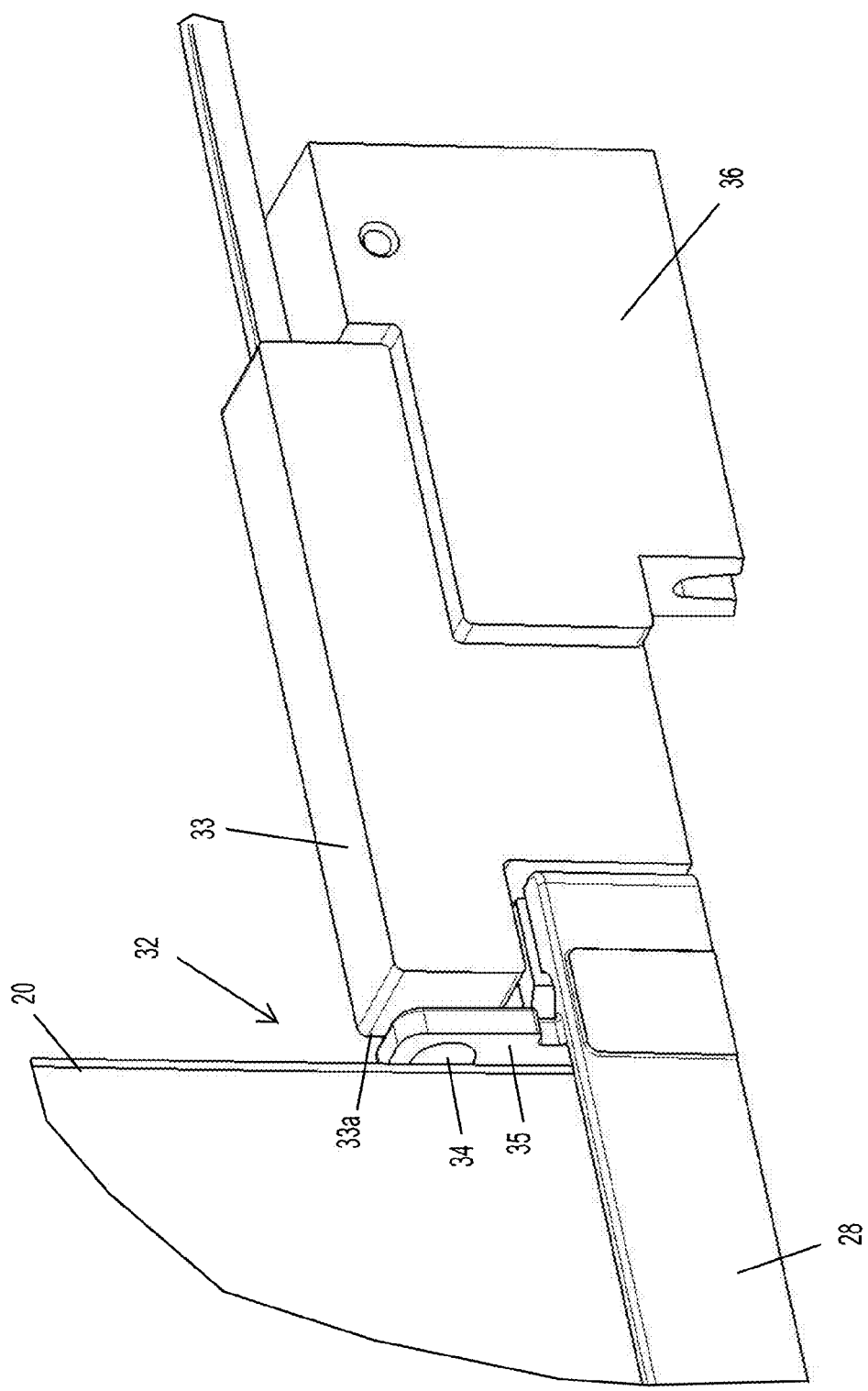
FIG. 5 is an enlarged perspective view of an end region of the lower channel element of FIG. 4, with the movable window panel at its closed position.

Referring now to the drawings and the illustrative embodiments depicted therein, a rear slider window assembly 10 of a vehicle 12 (such as a pickup truck or the like) includes a window frame 14, a pair of side fixed window panels 16, 18 and a movable window panel 20 that is movable relative to frame 14 and fixed window panels 16, 18 between an opened position and a closed position (FIGS. 1-3). Frame 14 comprises an upper rail 22 and a lower rail 24, with the upper and lower edge regions of movable window panel 20 movably or slidably received in and along the respective upper and lower rails 22, 24. Lower rail 24 comprises an elongated generally U-shaped channel portion 26 disposed generally horizontally along the rear slider window and spanning at least part of each of the fixed window panels 16, 18. The lower edge region 20a of the movable window panel 20 is received in or attached to a carrier 28, which is movably received in channel portion 26 of lower rail 24 and is movable or slidable along channel portion 26 as the movable window panel 20 is moved between its opened and closed positions via operation of a cable drive system 30. The window assembly 10 includes a sensing system 32 for determining the position of the movable window panel, such as determining when the window panel is fully closed. The sensing system 32 comprises a non-contacting sensor 33 (such as a magneto-responsive sensor or the like) disposed at an end of the channel portion 26, such as at an end cap or cable guide 36, and a magnetic element or detectable element 34 disposed at the respective end of the carrier 28. The sensor 33 detects the presence or proximity of the magnetic element 34 to determine when the movable window panel is fully closed, as discussed below.

In the illustrated embodiment, the sensor and its circuitry are embedded as a unit at the end stop or cable guide at the end of the channel. The sensor circuitry may be potted into a sensor module or housing or unit that attaches at the end stop or cable guide (with wiring that extends from the sensor unit for electrical connection to wiring of the vehicle), while a small magnet may be embedded at or disposed at the end of the movable window carrier. Thus, the sensing system of the present invention provides a compact sensor (and circuitry) established at or embedded at the end stop or cable guide at the end of the channel of the window assembly. The sensor comprises a non-contacting sensor that senses the presence of the magnet without requiring contact with the magnetic element.

In the illustrated embodiment, window assembly 10 includes two fixed window panels or panel portions 16, 18 that are spaced apart so as to define an opening therebetween. The fixed window panels may comprise two separate spaced apart fixed window panels that define the opening therebetween (and with upper and lower appliqués or trim or filler panels or elements disposed at the upper and lower regions of the opening and between the fixed window panels), while remaining within the spirit and scope of the present invention. Optionally, the window assembly may comprise a hole-in-glass window configuration, where a single fixed glass panel has an aperture or hole or opening established therethrough to define separate spaced apart fixed window panels or panel portions, such as in a similar manner as the window assemblies described in International Publication No. WO 2012/037190, which is hereby incorporated herein by reference in its entirety.

Slider or movable window panel 20 is movable along lower rail 24 and upper rail 22 of frame portion 14 to open and close the aperture or opening, such as in a manner similar to known slider window assemblies. Slider window panel 20 is disposed at lower carrier 28, which may receive the lower perimeter edge region 20a of the slider window panel 20 therein and is slidably or movably received in the channel portion 26 of the lower rail 24 of frame portion 14. Upper rail 22 may comprise any suitable channel or rail element configured to slidably receive an upper edge portion of the movable window panel, and upper rail 22 may comprise a unitarily formed upper rail or channel.

Figure 10:
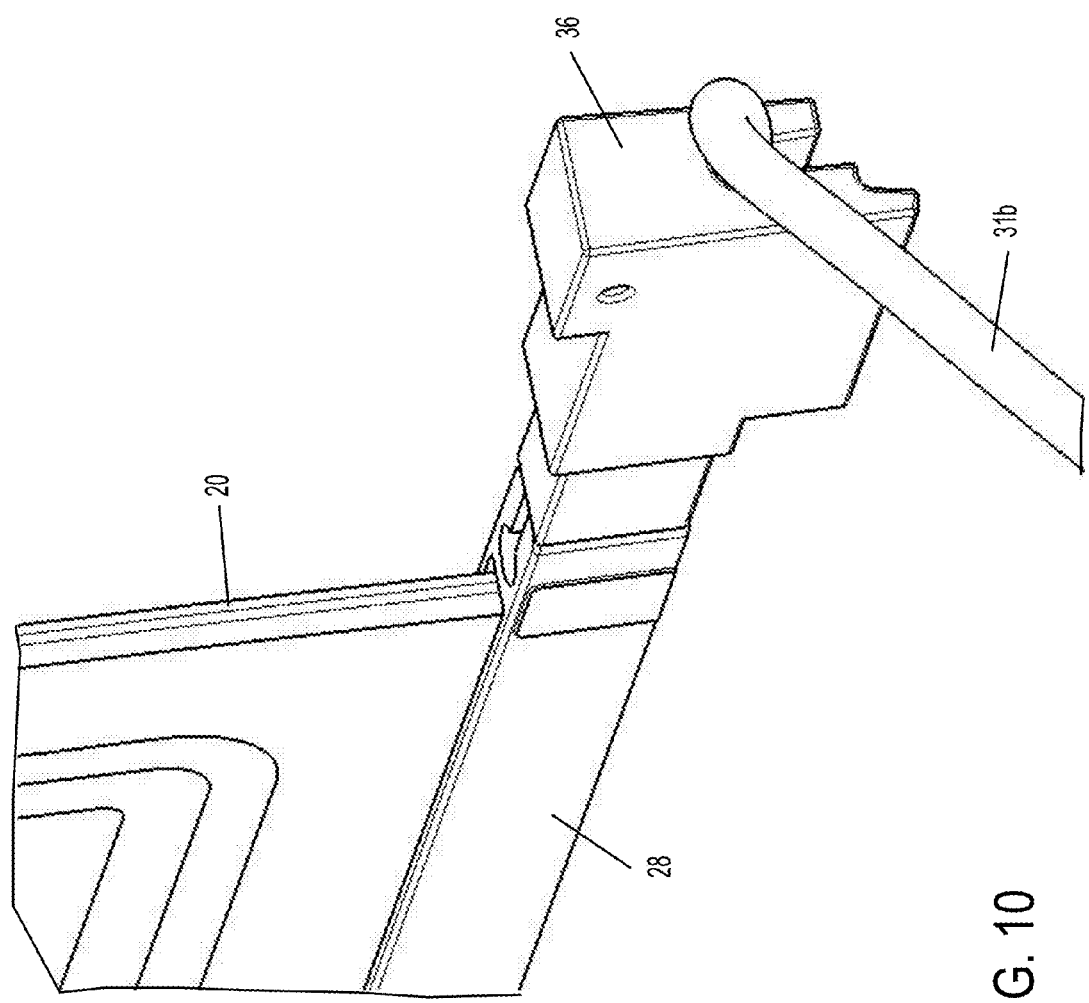
FIG. 10 is an enlarged perspective view of the end cap of FIG. 9, shown at the end of the carrier of the movable window panel, with the sensor and magnetic element removed.

The movable or slider window panel 20 may be movable such as via manual pushing or pulling at the window panel and preferably is movable in response to actuation of a drive motor 30a of the drive motor assembly or system 30, which may move cables or wires 31a (FIG. 8) of cable assemblies 31 relative to the sheath 31b of the cable assemblies 31 to impart horizontal movement of the carrier 28 and slider window panel 20 along the rails 22, 24. As can be seen with reference to FIGS. 7, 8 and 10, the cable sheath and cable or wire are routed through and/or retained at the cable guides 36 that are disposed at the end regions of the channel portion 26 of the lower rail 24. The end caps or cable guides or guide portions 36 are disposed at the ends of channel portion 26 at or near opposite end regions thereof, whereby the cable sheath 31b of the cable 31 of the drive system 30 attaches at or is guided and retained at the guide portions 36 and the cable portion 31a of the cable 31 attaches to the carrier 28 (such as by being received in and retained in a slot 28a (FIG. 8) at the end of the carrier 28) of the movable window panel 20. The end guides may utilize aspects of the end guides described in U.S. Pat. No. 8,938,914, which is hereby incorporated herein by reference in its entirety. Optionally, the drive motor assembly 30a may utilize aspects of the drive assemblies of the types described in U.S. Pat. Nos. 4,920,698; 4,995,195; 5,146,712; 5,531,046; 5,572,376; 6,955,009 and/or 7,073,293, and/or U.S. Publication Nos. US-2004-0020131 and/or US-2008-0127563, which are all hereby incorporated herein by reference in their entireties.

Thus, the movable window panel is movable along the upper and lower channels or rails between its opened and closed positions. The sensing system 32 is operable to determine when the movable window panel is at its fully closed position, so as to provide an indication to the driver of the vehicle equipped with the window assembly to inform the driver that the window is fully closed. For example, when the window panel is open, an indication light (such as a light emitting diode or LED or the like) at the instrument panel of the vehicle (or elsewhere in the vehicle cabin and viewable by the driver) will be activated to notify the driver that the window is opened (optionally, an audible indication device can also or otherwise be installed), and when the window is fully closed, the indicator (visual and/or audible) will be deactivated, thus indicating to the driver that the window is fully closed and latched.

The sensing system of the present invention uses a non-contacting magneto-responsive sensor, such as a uni-polar Hall Effect latch sensor or the like, to indicate the position of the movable window panel. The sensing device includes a Hall Effect sensor and a bypass capacitor. The Hall Effect sensor uses an inverted pole as the active pole to trigger the sensor. Some modification may be made in the vehicle's ECU to provide the proper response to the sensing device.

Figure 6:
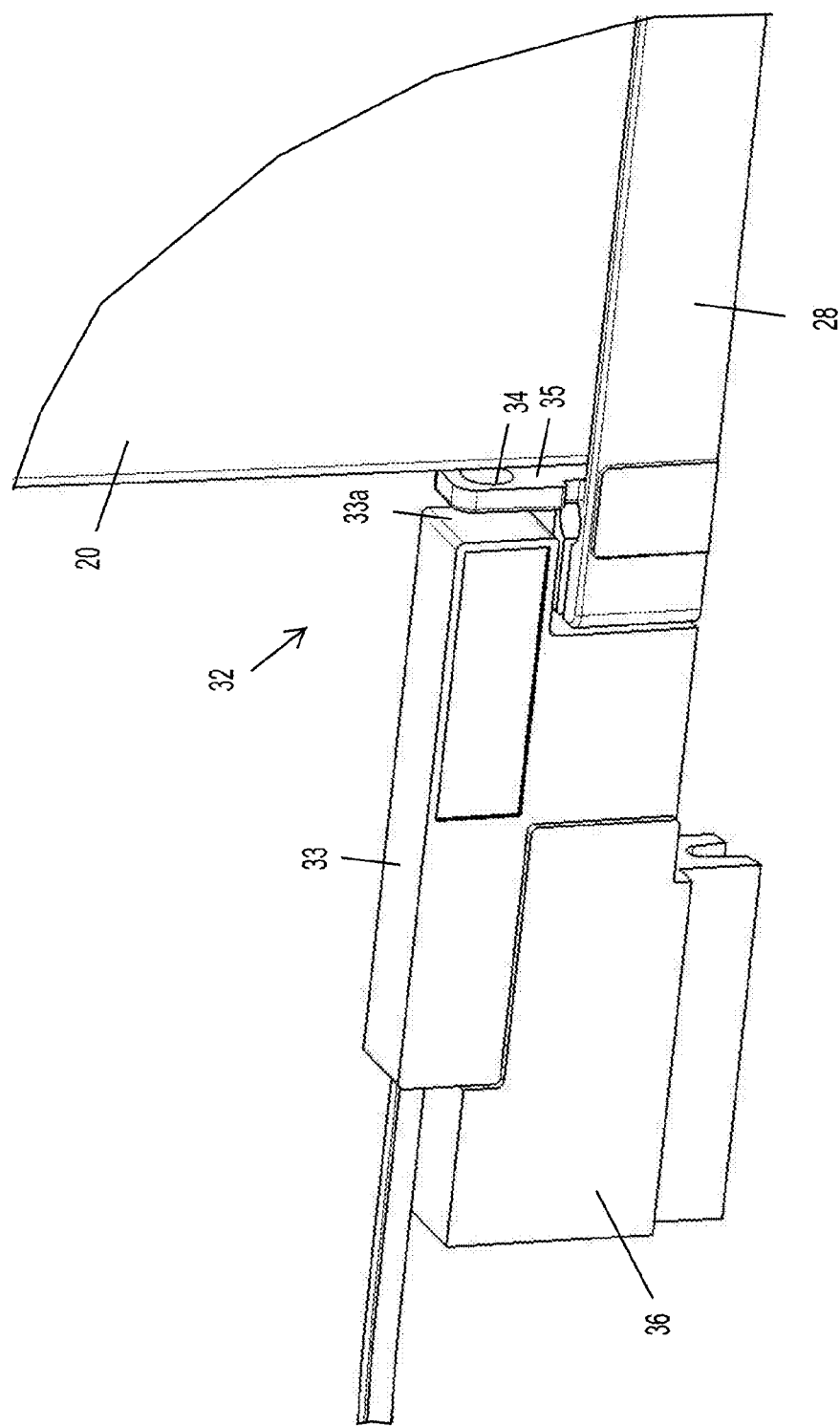
FIG. 6 is another enlarged perspective view of the end region of the lower channel element of FIG. 4.

As shown in FIGS. 5-9, the sensing device can be used on the sliding window to indicate the position of the window. In the illustrated embodiment, the magnetic element 34 is disposed at a housing or element 35 that protrudes upwardly from the carrier 28. The protruding element 35 may be detachably attached at the end region of the carrier 28 or may be formed as part of the end region of the carrier (such as molded as part of the end region of the carrier during an injection molding process). Thus, as the movable window is moved to its closed position, a portion 33a (such as a sensing end) of the sensor 33 is positioned at or near the magnetic element 34. The sensing element or device may be disposed anywhere in the sensor or sensor housing (that is configured to attach at or mate with the cable guide or end cap), whereby the sensor detects the presence or proximity of the magnetic element when the magnetic element is generally at the end portion 33a of the sensor. For example, and such as shown in FIG. 6, the sensor housing may be formed to partially receive the end of the carrier therein (with the cable attached at or received at the slot 28a at the end of the carrier passing through a passageway 36a (FIG. 9) through a lower portion of the sensor housing and to the end cap or cable guide 36) such that the sensing end 33a of the sensor 33 is proximate to the magnetic element 34 when the movable window panel is closed.

Figure 7:
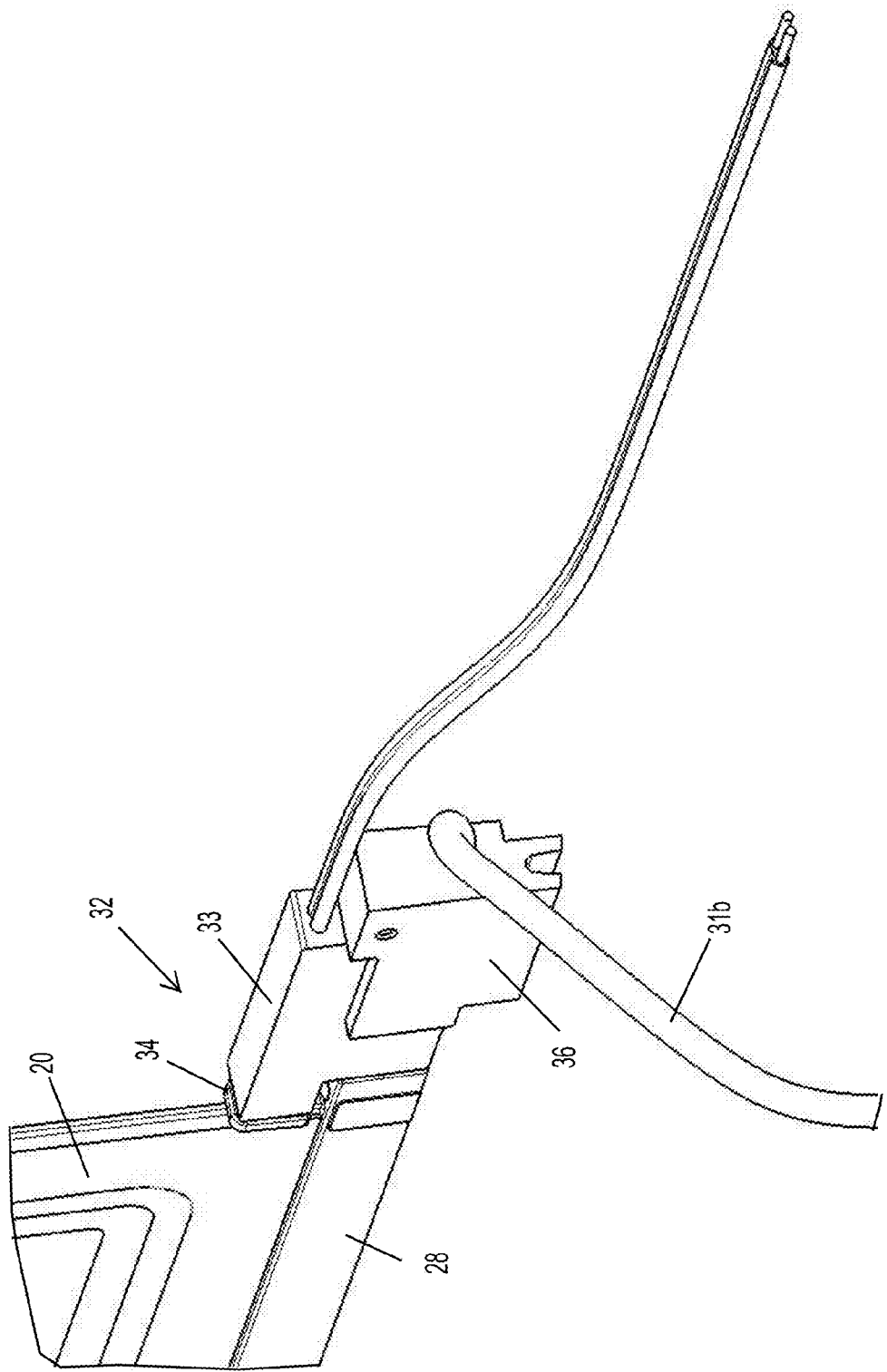
FIG. 7 is another enlarged perspective view of the end region of the lower channel element of FIG. 4.
Figure 8:
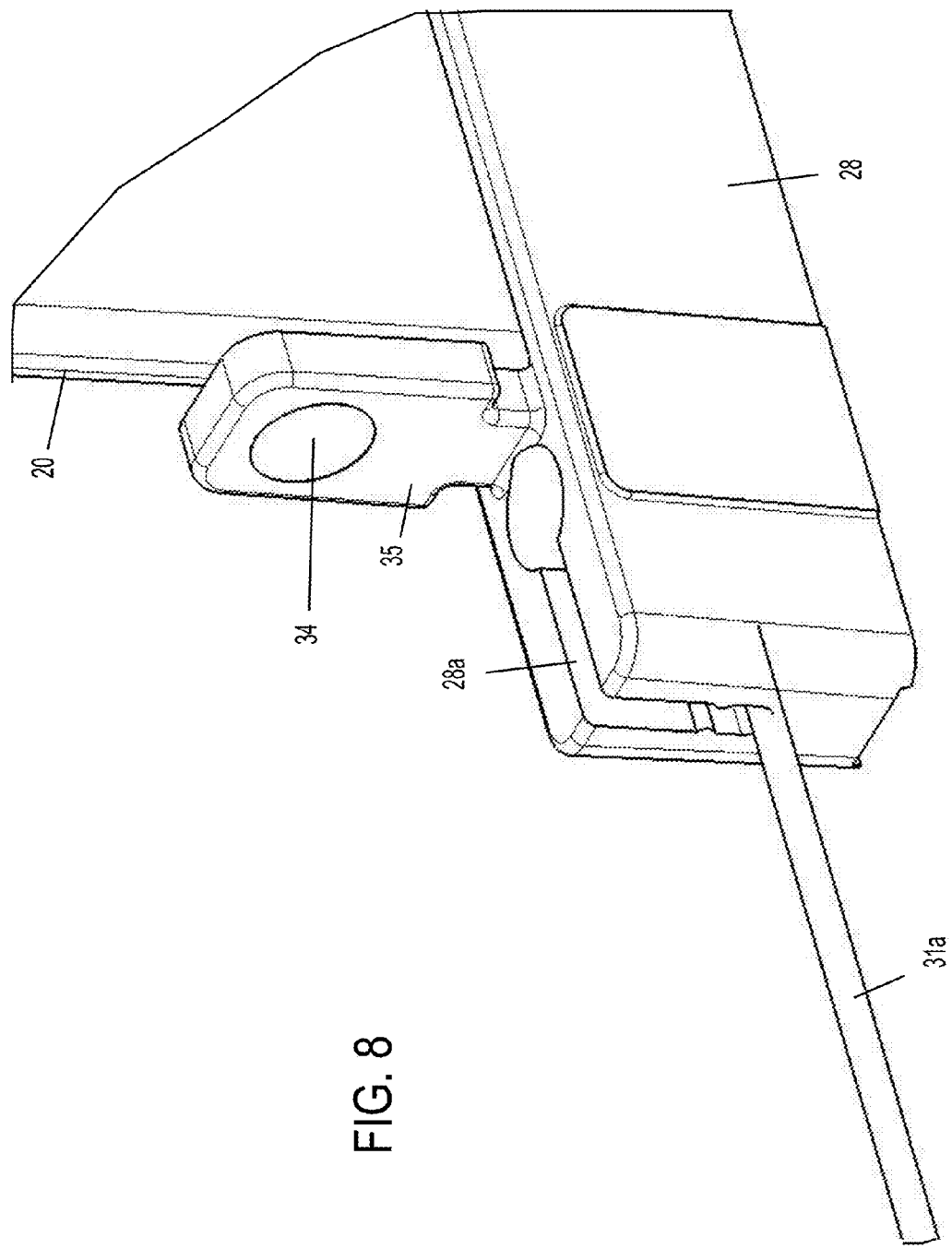
FIG. 8 is an enlarged perspective view of the end region of the carrier of the movable window panel of FIG. 4, showing the magnetic element disposed thereat.
Figure 9:
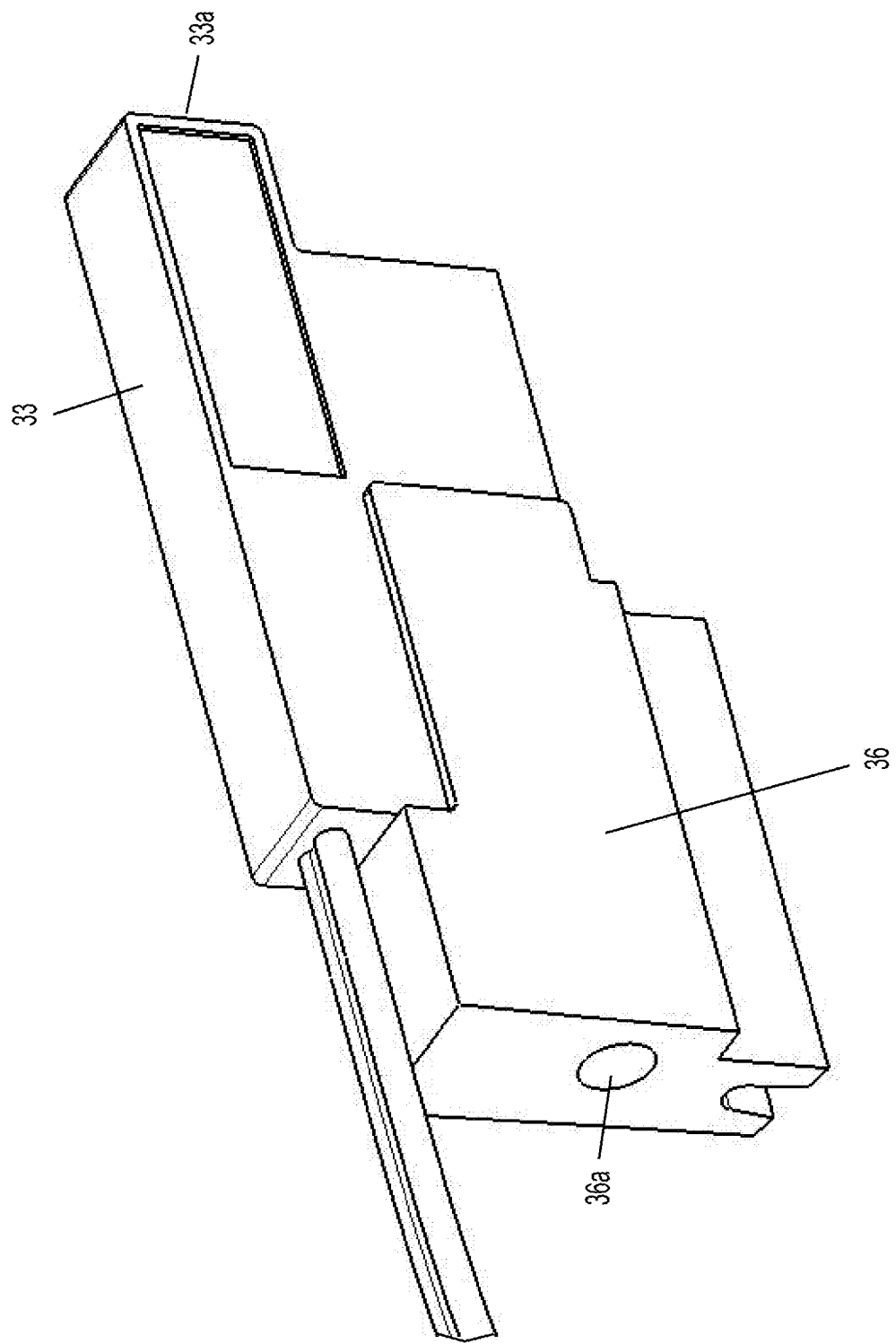
FIG. 9 is an enlarged perspective view of the end region of the end cap and sensor removed from the lower channel element.
Figure 11:
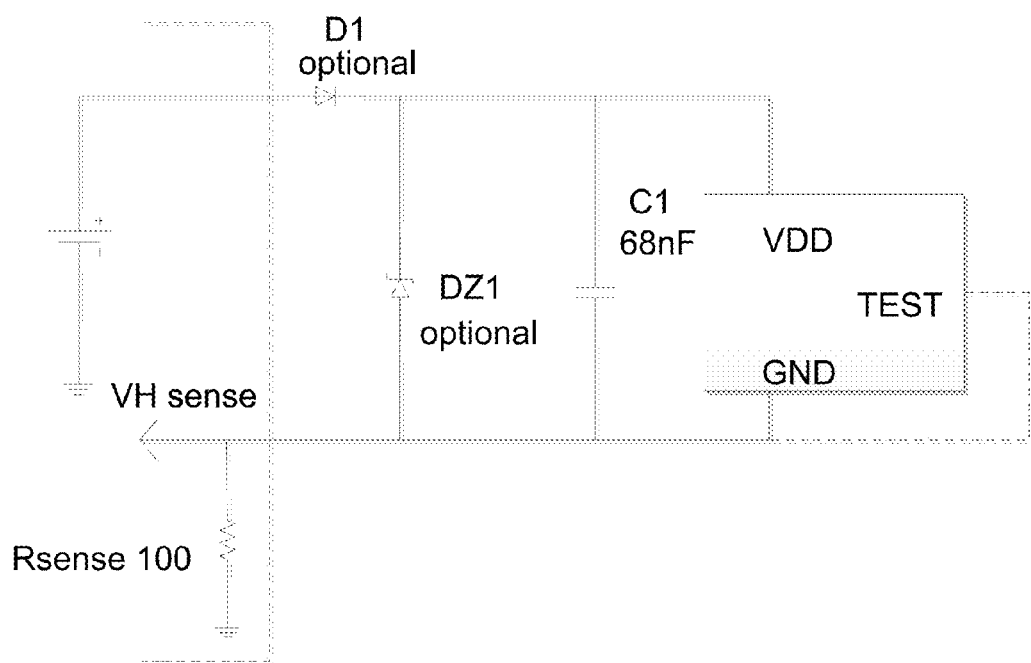
FIG. 11 is a schematic of a Hall Effect sensor circuit suitable for use in the sensing system of the present invention.

A typical Hall Effect sensor application circuit is shown in FIG. 11. Such a circuit is suitable for use in connection with the rear slider sensing system of the present invention. In the present application, a simplified circuit may be used. Because the supply voltage from the ECU will be only 12 Volts nominal, it will not over stress the Hall Effect sensor. Thus, the application circuit may not include the diode and the zener diode in the circuit of FIG. 11, and may just use the Hall Effect sensor (inverted active) and a bypass capacitor. A magnetic element or magnet is installed on the window (such as at the end of the carrier as shown in FIGS. 6-8) to trigger the Hall Effect sensor to switch on/off responsive to the distance that the magnet is from the sensor. The Hall Effect sensor and the bypass capacitor are preferably built in as part of a sensor module or unit (FIGS. 6, 7 and 9) and installed in the appropriate location on the window (such as at the end cap or end cable guide at the end of the lower channel). Optionally, the sensor and magnet may be disposed at an upper channel or rail and upper portion of the movable window, while remaining within the spirit and scope of the present invention.

Figure 12:
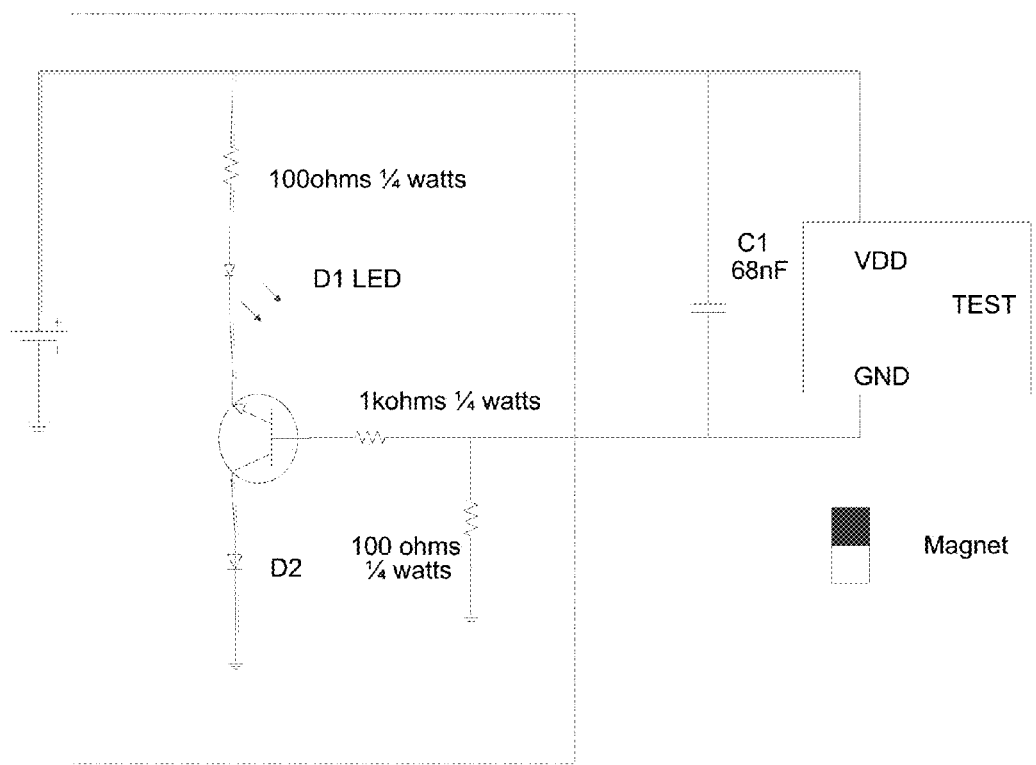
FIG. 12 is a schematic of another Hall Effect sensor and indicator circuit suitable for use in the system of the present invention.

As shown in FIG. 12, an exemplary circuit is provided that may provide the functionality of the sensing device when it is used in the vehicle. The LED represents the light or LED disposed at the vehicle control panel or elsewhere in the cabin of the vehicle and viewable by a driver of the vehicle. When the slider window opens, the sensor senses a gap between the sensor and the magnet and the LED is activated. The LED is deactivated when the slide window is closed (and the sensor circuit determines that the magnet is close to or in contact with the sensor).

Hall Effect Sensors are devices which are activated by an external magnetic field. A magnetic field has two important characteristics: flux density (B) and polarity (North and South Poles). The output signal from a Hall Effect sensor is the function of magnetic field density around the device. When the magnetic flux density around the sensor exceeds a certain pre-set threshold, the sensor detects it and generates an output voltage called the Hall Voltage (VH).

Figure 13:
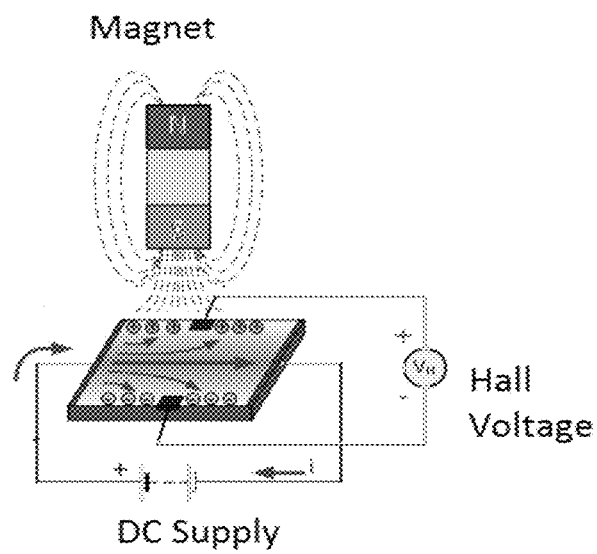
FIG. 13 is a schematic showing operation of a Hall Effect sensor.

Referring now to the diagram of FIG. 13, the Hall Effect Sensor comprises basically of a thin piece of rectangular p-type semiconductor material, such as gallium arsenide (GaAs), indium antimonide (InSb) or indium arsenide (InAs) or the like, passing a continuous current through itself. When the device is placed within a magnetic field (such as at or near a magnetic element or magnet), the magnetic flux lines exert a force on the semiconductor material which deflects the charge carriers, electrons and holes, to either side of the semiconductor slab. This movement of charge carriers is a result of the magnetic force they experience passing through the semiconductor material.

As these electrons and holes move side wards, a potential difference is produced between the two sides of the semiconductor material by the build-up of these charge carriers. Then the movement of electrons through the semiconductor material is affected by the presence of an external magnetic field which is at right angles to it, and this effect is greater in a flat rectangular shaped material.

The effect of generating a measurable voltage by using a magnetic field is called the Hall Effect with the basic physical principle underlying the Hall Effect being Lorentz force. To generate a potential difference across the device, the magnetic flux lines are perpendicular (90 degrees) to the flow of current and of the correct polarity.

Figure 14:
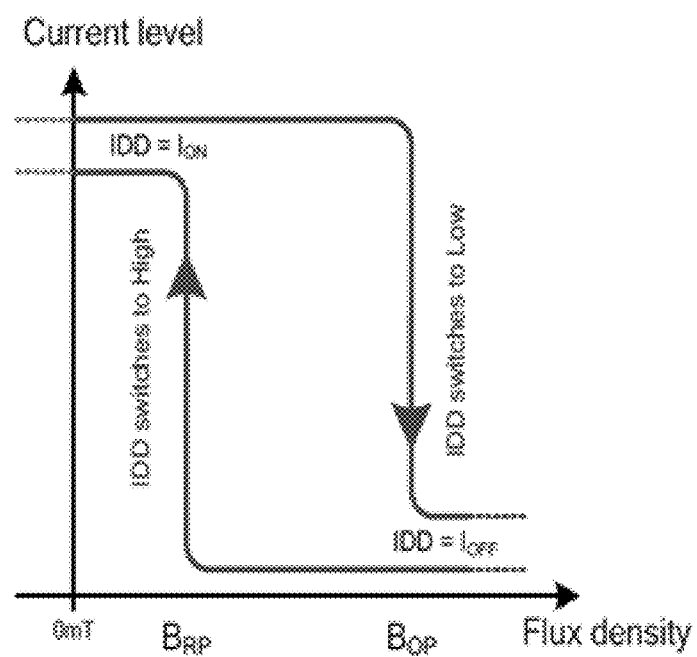
FIG. 14 is a graph showing the change in output current of the sensor circuit responsive to the proximity of the magnet to the sensor in accordance with the present invention.

Generally, Hall Effect sensors and switches are designed to be in the "OFF" (open circuit condition) when there is no magnetic field present. They only turn "ON" (closed circuit condition) when subjected to a magnetic field of sufficient strength and polarity. In the case of the sensing system of the present invention, the system uses an inverted South Pole active device or sensor, which has a high output current (IDD) when there is no magnet present. When there are enough magnetic fields present, the output current will switch to low. An exemplary current level VS flux density of the inverted South Pole active plot is shown in FIG. 14. As can be seen in FIG. 14, the system may provide a high output current IDD (to operate or energize or activate the LED) until the detected flux density reaches a threshold level ($B_{OP}$), whereby the output current switches to low or off to deactivate or de-energize the LED). Likewise, when the window is fully closed, the system may provide a low output level until the detected flux density reaches a threshold level ($B_{RP}$), whereby the output current switches to high or on to activate or energize the LED. The threshold levels where the system changes from the high output level to the low output level and from the low output level to the high output level may be the same threshold level (same flux density) or may be different levels (such as shown in FIG. 14, where the threshold level to turn on the LED is greater than the threshold level to turn off the LED).

Thus, during operation of the sensing system of the present invention, when the window is closed, the magnetic field (the magnet at the carrier) is present at and close to the sensor (at the end guide), and the output current switches to low. Thus, there is not enough voltage provided at the base of the transistor to turn it on and thus, there is no current through the LED and the LED is deactivated. When the window is at least partially opened, there is no magnetic field close to the sensor (the magnet at the carrier is moved away from the end guide), and the output current switches to high. Thus, the higher output current turns the transistor on and activates the LED. The sensing system of the present invention thus senses the position of the window or at least senses when the movable window panel is fully closed and when it is not fully closed, whereby an appropriate indication is provided to the driver of the vehicle.

In the illustrated embodiment, the fixed window panels 16, 18 each include an electrically conductive heater grid 38, 40 or other heating element or electrically operable element established at the window panels (such as at or on an interior surface of the window panels) and movable window panel 20 includes an electrically conductive heater grid or other heating element or electrically operable element 42 established at the window panel (such as at or on an interior surface of the movable window panel). The heater grids 38, 40 are electrically conductively connected to (or are otherwise in electrical conductive continuity with) a power source of the vehicle and may be powered (such as responsive to a user actuatable input or switch or button of the vehicle or responsive to a sensor or accessory of the vehicle) to heat or defrost or defog the fixed window panels 16, 18. Movable panel heater grid 42 is electrically connected to the power source (and may be electrically connected to electrical terminals or elements at one of the heater grids 38, 40 of the fixed window panels) and may be electrically powered to heat or defrost or defog the movable window panel 20. Heater grids 38, 40, 42 comprise a plurality of electrically conductive traces that extend across the respective window panels 16, 18, 20 between respective busbars to provide enhanced and more uniform heating and defrosting/defogging of the window panel, as also discussed below. The heater grid 42 of movable window panel 20 may be powered in a manner that allows for heating or defogging or defrosting of the movable window panel irrespective of whether the movable window panel is opened or partially opened or closed. For example, the electrical connections may be made via a flexible connector or wire or cable or the like, such as by utilizing aspects of the rear slider window assemblies described in U.S. Pat. No. 8,402,695 and/or International Publication No. WO 2012/037190, which are hereby incorporated herein by reference in their entireties. Optionally, the heater grid of the movable window panel may be powered only when in its closed position and/or via any suitable powering means.

In the illustrated embodiment, lower rail 24 comprises a unitarily formed (such as via molding or injection molding or the like) rail having a generally U-shaped channel portion 26 that is arranged generally horizontally across the rear slider window assembly. Lower rail 24 may be formed via any suitable forming means and may comprise any suitable material or materials. For example, lower rail 24 may comprise a rigid or substantially rigid molded polymeric channel (such as a polyvinylchloride material or PC—ABS or the like), and preferably a rigid polymeric material or engineered plastic material. The channel portion 26 is an elongated generally U-shaped channel having a base or lower wall and a pair of spaced apart generally vertical walls extending upwardly from the base or lower wall. The cable guides 36 are disposed at the opposite ends of the channel portion 26 and extend upwardly from the base wall and span between the spaced apart walls so as to close the end regions of the channel with the cable guide at the sensing end having the sensor disposed thereat.

The benefits of embodiments of the present invention may also be realized in sliding window constructions where an aperture is created in a fixed window panel and where a movable window panel can be made to open or close the aperture. Slider windows of this type are disclosed such as in U.S. Publication No. US-2003-0213179, and/or such as in RE41502, and/or such as in International Publication Nos. WO 2012/037190 and/or WO 2012/088287, which are hereby incorporated herein by reference in their entireties. The benefits of embodiments of the present invention may also be realized in vehicular movable window assemblies other than a rear slider window assembly for a pickup truck or the like, such as (for example) a slider window assembly suitable for use as a movable side window for a vehicle such as a van or a bus.

Optionally, the window assembly or assemblies of the present invention may utilize aspects of the window assemblies described in U.S. Pat. Nos. 8,402,695; 7,073,293; 7,003,916; 6,119,401; 6,026,611; 5,996,284; 5,799,444 and/or 6,691,464, and/or U.S. Publication Nos. US-2006-0107600; US-2008-0127563; US-2004-0020131 and/or US-2003-0213179, and/or International Publication Nos. WO 2012/037190; WO 2012/088287 and/or WO 2012/148968, all of which are hereby incorporated herein by reference in their entireties.

Changes and modifications to the specifically described embodiments may be carried out without departing from the principles of the present invention, which is intended to be limited only by the scope of the appended claims, as interpreted according to the principles of patent law.

The invention claimed is:

1. A slider window assembly for a vehicle, said slider window assembly comprising:
    a frame portion having an upper rail and a lower rail;
    at least one fixed window panel, said at least one fixed window panel at least partially defining an opening, wherein said upper and lower rails are fixedly attached to an interior surface of said at least one fixed window panel;
    a movable window panel that is movable along and between said upper rail and said lower rail, wherein said movable window panel is movable between a closed position, where said movable window panel closes said opening, and an opened position, where said movable window panel is located at least partially away from said opening;
    a carrier that receives a lower perimeter edge region of said movable window panel therein, wherein said carrier is received in a channel portion of said lower rail and moves along said channel portion of said lower rail with said movable window panel as said movable window panel is moved between said opened position and said closed position;
    wherein said lower rail has an end stop at an end of said channel portion, and wherein said end stop is configured to limit movement of said carrier along said channel portion when said movable window panel is moved to said closed position;
    a sensing system operable to determine when the movable window panel is in said closed position and when the movable window panel is not in said closed position, wherein said sensing system comprises (i) a non-contacting magneto-responsive sensor adjacent said end stop at said end of said channel portion of said lower rail and (ii) a magnetic element on an end portion of said carrier, wherein said magnetic element approaches said non-contacting magneto-responsive sensor adjacent said end stop at said end of said channel portion of said lower rail when said movable window panel moves from said open position towards said closed position;
    wherein, when said movable window panel is in said closed position, said magneto-responsive sensor detects said magnetic element;
    wherein, when said movable window panel is not in said closed position, said magneto-responsive sensor does not detect said magnetic element; and
    wherein, when said magneto-responsive sensor does not detect said magnetic element, said sensing system determines that said movable window panel is not in said closed position and generates an indicator activating output signal that causes activation of an indicator in a cabin of the vehicle to alert a driver in the vehicle that the movable window panel is not in said closed position, and wherein the indicator in the cabin of the vehicle is viewable by the driver in the vehicle.

2. The slider window assembly of claim 1, wherein said sensing system generates a second output signal different than said indicator activating output signal when said sensing system determines that said movable window panel is in said closed position.

3. The slider window assembly of claim 1, wherein said movable window panel is movable between said opened and closed positions by a cable drive system, and wherein cables of said cable drive system are guided by cable guides, and wherein said end stop comprises one of said cable guides and said magneto-responsive sensor is adjacent said one of said cable guides.

4. The slider window assembly of claim 3, wherein said magneto-responsive sensor comprises a base portion and a sensor portion, and wherein said base portion is configured to contact said carrier when said movable window panel is moved to said closed position, and wherein, when said movable window panel is in said closed position and said base portion is contacting said carrier, said sensor portion is spaced from said magnetic element on said end portion of said carrier.

5. The slider window assembly of claim 4, wherein said sensor portion of said magneto-responsive sensor is above said end portion of said carrier when said movable window panel is in said closed position.

6. The slider window assembly of claim 5, wherein said magneto-responsive sensor and associated circuitry are part of a sensor unit that is adjacent said end stop.

7. The slider window assembly of claim 1, wherein said at least one fixed window panel comprises first and second fixed window panels at least partially defining said opening therebetween.

8. The slider window assembly of claim 1, wherein said at least one fixed window panel comprises a single fixed window panel defining said opening.

9. The slider window assembly of claim 1, wherein said magneto-responsive sensor comprises a Hall Effect sensor.

10. The slider window assembly of claim 1, wherein said magneto-responsive sensor and associated circuitry are part of a unit, and wherein said unit is at least partially in said end stop at said end of said channel portion of said lower rail.

11. The slider window assembly of claim 10, wherein said end stop comprises a cable guide at said end of said channel portion of said lower rail.

12. A slider window assembly for a vehicle, said slider window assembly comprising:
a frame portion having an upper rail and a lower rail;
at least one fixed window panel, said at least one fixed window panel at least partially defining an opening, wherein said upper and lower rails are fixedly attached to an interior surface of said at least one fixed window panel;
a movable window panel that is movable along said upper rail and said lower rail, wherein a lower portion of said movable window panel is partially received in a carrier that is movably received in a channel portion of said lower rail, wherein said movable window panel is movable between a closed position, where said movable window panel is closes said opening, and an opened position, where said movable window panel is located at least partially away from said opening;
wherein said movable window panel is movable between said opened and closed positions by a cable drive system, and wherein cables of said cable drive system are guided by cable guides at opposite ends of said channel portion of said lower rail;
a sensing system operable to determine when the movable window panel is in said closed position and when the movable window panel is not in said closed position, wherein said sensing system comprises (i) a non-contacting magneto-responsive sensor adjacent one of said cable guides and (ii) a magnetic element on an end portion of said carrier of said movable window panel, said magnetic element approaches said non-contacting magneto-responsive sensor at said one of said cable guides when said movable window panel moves from said opened position towards said closed position;
wherein said carrier comprises a cable receiving portion at said end portion of said carrier and wherein said magnetic element is disposed above said cable receiving portion;
wherein, when said movable window panel is in said closed position, said magneto-responsive sensor is positioned at least partially above said cable receiving portion and said magneto-responsive sensor detects said magnetic element;
wherein, when said movable window panel is not in said closed position, said magneto-responsive sensor does not detect said magnetic element; and
wherein, when said magneto-responsive sensor does not detect said magnetic element, said sensing system determines that said movable window panel is not in said closed position and generates an indicator activating output signal that causes activation of an indicator in a cabin of the vehicle to alert a driver in the vehicle that the movable window panel is not in said closed position, and wherein the indicator in the cabin of the vehicle is viewable by the driver of the vehicle.

13. The slider window assembly of claim 12, wherein said sensing system generates a second output signal different than said indicator activating output signal when said sensing system determines that said movable window panel is in said closed position.

14. The slider window assembly of claim 12, wherein said at least one fixed window panel is selected from the group consisting of (i) first and second fixed window panels at least partially defining said opening therebetween and (ii) a single fixed window panel defining said opening.

15. The slider window assembly of claim 12, wherein said magneto-responsive sensor comprises a Hall Effect sensor.

16. The slider window assembly of claim 12, wherein said magneto-responsive sensor and associated circuitry are part of a unit, and wherein said unit is at least partially in said one of said cable guides.

17. The slider window assembly of claim 12, wherein said carrier comprises a molded plastic carrier and wherein said magnetic element is disposed on a portion of said cable receiving portion.

18. A slider window assembly for a vehicle, said slider window assembly comprising:
a frame portion having an upper rail and a lower rail;
at least one fixed window panel, said at least one fixed window panel at least partially defining an opening, wherein said upper and lower rails are fixedly attached to an interior surface of said at least one fixed window panel;
a movable window panel that is movable along said upper rail and said lower rail, wherein a lower region of said movable window panel is partially received in a carrier that is movably received in a channel portion of said lower rail, wherein said movable window panel is movable between a closed position, where said movable window panel closes said opening, and an opened position, where said movable window panel is located at least partially away from said opening;
a sensing system operable to determine when the movable window panel is in said closed position and when the movable window panel is not in said closed position, wherein said sensing system comprises (i) a non-contacting magneto-responsive sensor adjacent an end of said lower rail of said frame portion and (ii) a magnetic element on an end portion of said carrier that approaches said non-contacting magneto-responsive sensor adjacent said end of said lower rail when said movable window panel moves from said opened position towards said closed position;

wherein said movable window panel is movable between said opened and closed positions by a cable drive system, and wherein cables of said cable drive system are guided by cable guides at opposite ends of said channel portion of said lower rail;

wherein said magneto-responsive sensor and associated circuitry are part of a sensing unit, and wherein one of said cable guides is disposed adjacent said end of said lower rail and said sensing unit is at least partially in said one of said cable guides;

wherein said carrier comprises a cable receiving portion at said end portion of said carrier and wherein said magnetic element is on said cable receiving portion;

wherein when said movable window panel is in said closed position, said magneto-responsive sensor is proximate to and spaced from said magnetic element and detects said magnetic element;

wherein, when said movable window panel is not in said closed position, said magneto-responsive sensor does not detect said magnetic element; and wherein, when said magneto-responsive sensor does not detect said magnetic element, said sensing system determines that said movable window panel is not in said closed position and generates an indicator activating output signal that causes activation of an indicator in a cabin of the vehicle to alert a driver in the vehicle that the movable window panel is not in said closed position, and wherein the indicator in the cabin of the vehicle is viewable by the driver in the vehicle.

19. The slider window assembly of claim 18, wherein said sensing system generates a second output signal different than said indicator activating output signal when said sensing system determines that said movable window panel is in said closed position.

20. The slider window assembly of claim 18, wherein said magneto-responsive sensor comprises a Hall Effect sensor.

\* \* \* \* \*

UNITED STATES PATENT AND TRADEMARK OFFICE
CERTIFICATE OF CORRECTION

PATENT NO. : 9,731,580 B2  
APPLICATION NO. : 14/920172  
DATED : August 15, 2017  
INVENTOR(S) : Darin J. Snider et al.

Page 1 of 1

It is certified that error appears in the above-identified patent and that said Letters Patent is hereby corrected as shown below:

In the Claims

Column 8  
Claim 1, Line 43, "said open position" should be --said opened position--

Column 9  
Claim 6, Line 43, "window panel is closes" should be --window panel closes--

Column 10  
Claim 12, Line 23, "of the vehicle." should be --in the vehicle.--

Signed and Sealed this  
Twentieth Day of November, 2018

Andrei Iancu  
*Director of the United States Patent and Trademark Office*